United States Patent
Sato et al.

(10) Patent No.: US 6,743,377 B2
(45) Date of Patent: Jun. 1, 2004

(54) SMECTIC POLYMER LIQUID CRYSTALS, PROCESS FOR PRODUCTION THEREOF AND ELECTRONIC DEVICE

(75) Inventors: Koichi Sato, Atsugi (JP); Akira Tsuboyama, Sagamihara (JP); Yukio Hanyu, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 74 days.

(21) Appl. No.: 09/983,103

(22) Filed: Oct. 23, 2001

(65) Prior Publication Data

US 2002/0094390 A1 Jul. 18, 2002

(30) Foreign Application Priority Data

Oct. 25, 2000 (JP) ........................... 2000/324814
Jun. 11, 2001 (JP) ........................... 2001/175078

(51) Int. Cl.$^7$ ............................................. C09K 19/20
(52) U.S. Cl. ........................... 252/299.64; 252/299.67; 428/1.1
(58) Field of Search .................... 252/299.01–299.7; 428/1

(56) References Cited

U.S. PATENT DOCUMENTS

| | | | | |
|---|---|---|---|---|
| 5,422,748 A | * | 6/1995 | Yamashita et al. | 252/299.61 |
| 5,615,027 A | | 3/1997 | Kuribayashi | 345/87 |
| 5,750,214 A | | 5/1998 | Ito et al. | 428/1 |
| 5,786,879 A | | 7/1998 | Kodera et al. | 349/134 |
| 5,790,223 A | | 8/1998 | Hanyu et al. | 349/184 |
| 5,825,447 A | | 10/1998 | Hanyu et al. | 349/128 |
| 5,835,248 A | | 11/1998 | Hanyu et al. | 359/76 |
| 5,858,273 A | | 1/1999 | Asaoka et al. | 252/299.4 |
| 5,885,482 A | | 3/1999 | Asaoka et al. | 252/299.01 |
| 5,932,136 A | | 8/1999 | Terada et al. | 252/299.01 |
| 6,083,574 A | | 7/2000 | Asao et al. | 428/1.1 |
| 6,128,064 A | | 10/2000 | Moriyama et al. | 349/173 |
| 6,154,265 A | | 11/2000 | Kamio et al. | 349/122 |
| 6,195,137 B1 | | 2/2001 | Inaba et al. | 349/37 |
| 6,221,444 B1 | | 4/2001 | Okada et al. | 428/1.25 |
| 6,252,641 B1 | | 6/2001 | Tsuzuki et al. | 349/122 |

FOREIGN PATENT DOCUMENTS

GB    2 252 636    *    8/1992    ......... G02F/1/133

OTHER PUBLICATIONS

Chigrin, et al., "Observation of total omnidirectional reflection from . . . ", Applied Physics A, vol. 68 (1999), pp. 25–28.
Tang, et al., "Organic electroluminescent diodes", Appl. Phys. Lett., vol. 51, No. 12 (1987), pp. 913–915.

* cited by examiner

*Primary Examiner*—Mark F. Huff
*Assistant Examiner*—Jennifer R. Sadula
(74) *Attorney, Agent, or Firm*—Fitzpatrick, Cella, Harper & Scinto

(57) ABSTRACT

A polymeric compound has a hexagonal system order (as its crystal system) in a higher order smectic phase, such as smectic B phase, smectic L phase, smectic E phase, etc. The polymeric compound is produced through polymerization of a liquid crystal compound having a polymerizable functional group, such as an acrylic group or a methacrylic group, in a state of assuming a hexagonal system order. An electronic device, preferably an electroluminescence device, using a layer of the polymeric compound disposed between a pair of electrodes exhibits good luminescence and carrier transport performances while retaining excellent reliability.

8 Claims, 2 Drawing Sheets

SMECTIC POLYMER LIQUID CRYSTALS, PROCESS FOR PRODUCTION THEREOF AND ELECTRONIC DEVICE

BACKGROUND OF THE INVENTION

The present invention relates to a polymeric compound suitably used in an electronic device applicable to functional devices including a luminescent device, such as an organic electroluminescent (EL) device or a light-emitting diode (LED), and an organic semiconductor device. The present invention also relates to a process for producing the polymeric compound and an electronic device using the polymeric compound.

In recent years, extensive studies on organic compounds for use in functional devices such as a luminescent device and a semiconductor device have been conducted. A typical example thereof include one regarding a photoconductive member used in electrophotography. The photoconductive member has been widely used in copying machines, electrophotographic printers, etc., in view of its advantages, such as excellent productivity and good functional properties.

Further, research and development regarding organic materials for use in a luminescent device, particularly an EL device, has been conducted extensively in recent years.

More specifically, C. W. Tang et al. have proposed an organic EL device having a function-separation type layer structure including a carrier transport layer and a luminescence layer (e.g., Appl. Phys. Lett., vol. 51, pp. 913 (1987) and U.S. Pat. No. 4,769,292).

In the circumstances, liquid crystal materials have been applied to the above-mentioned functional devices. More specifically, a high performance device has been prepared by utilizing a higher order (molecular alignment) structure of liquid crystal. For example, according to a study by Hanna on liquid crystalline organic semiconductors, Ohyou Butsuri, Appl. Phys., vol. 68, no. 1, pp. 26–32 (1999), it has been confirmed that a smectic liquid crystal showed a high carrier transport performance. With respect to the carrier transport performance, particularly electron and hole transport performances, a smectic liquid crystal having a (molecular alignment) structure of higher order represented by a hexagonal system order exhibits an especially higher carrier transport performance in its higher order liquid crystal phase of smectic B (SmB) or smectic E (SmE) than in its lower order liquid crystal phase of smectic A (SmA) or smectic C (SmC) in which the smectic liquid crystal only has a liquid like order.

However, it is difficult to stably realize the higher order smectic phase (e.g., SmB or SmE) wherein a smectic liquid crystal has the higher order structure described above in a broader temperature range. Further, a highly reliable electronic device utilizing such a higher order smectic phase has not been readily provided.

SUMMARY OF THE INVENTION

An object of the present invention is to provide a polymeric compound having a higher order smectic phase capable of practical use.

Another object of the present invention is to provide a process for producing the polymeric compound.

A further object of the present invention is to provide an electronic device using the polymeric compound with high reliability, thus improving device characteristics when used as a functional device, such as a luminescent device or an organic semiconductor device.

According to the present invention, there is provided a polymeric compound having a smectic phase and a hexagonal (crystal) system order in the smectic phase.

According to the present invention, there is also provided a process for producing a polymeric compound comprising the steps of polymerizing a liquid crystal compound having a polymerizable functional group in a state wherein the liquid crystal compound has a hexagonal system order.

The present invention provides an electronic device comprising at least one substrate, two electrodes disposed on said at least one substrate, and a polymer layer of at least one species of polymeric compound disposed between the two electrodes, wherein said at least one species of polymeric compound has a smectic phase and a hexagonal system order in the smectic phase.

As a result of our study, it has been found that a polymeric compound (solidified layer) having a hexagonal system order exhibits excellent functional properties in a higher order liquid crystal phase and that it becomes possible to realize a highly reliable electronic device excellent in environmental stability by using the polymeric compound.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
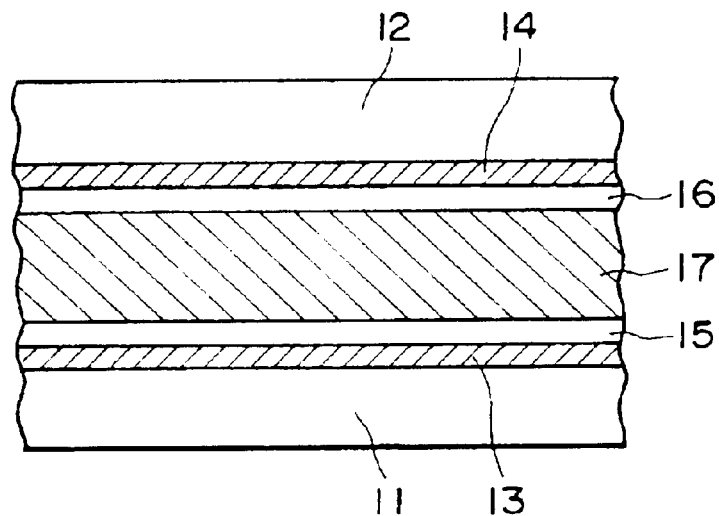
FIG. 1 is a schematic sectional view of an embodiment of the electronic device according to the present invention.

Herein, the "polymeric compound" refers to a solidified compound (or polymer liquid crystal) which has been substantially solidified through an increase in viscosity or elasticity of a liquid crystal having an ordinary flowability (fluidity) and thus is placed in such a state that a phase change does not occur or is considerably suppressed even at low temperature.

More specifically, according to measurement using a DSC (differential scanning calorimeter), the above state may include a state of frozen phase transition and a glassy liquid crystal state at a temperature of at most a glass transition temperature (Tg), wherein the polymeric compound can have a property of macroscopically changing its form like glassy material while retaining a short-range order between liquid crystal molecules.

The polymeric compound according to the present invention has a hexagonal system order in a smectic phase. The smectic phase may include higher order liquid crystal phases of smectic B (SmB), smectic L (SmL), smectic E (SmE), smectic I (SmI), smectic F (SmF), smectic J (SmJ), smectic G (SmG), smectic K (SmK) and smectic H (SmH). Of these higher order liquid crystal phases, SmB, SmL and SmE are preferred since a uniaxial alignment (orientation) characteristic is readily obtained.

Further, it is possible to use as the above-mentioned polymeric compound a composition comprising the polymeric compound described above in an amount of at least 60 wt. %, thus attaining advantages of the polymeric compound of the present invention. Accordingly, the composition may contain a low molecular weight compound component partially remaining in the polymeric compound or that externally added to the polymeric compound.

In the present invention, when the polymeric compound is used in an ordinary environment, the polymeric compound may preferably have a single liquid crystal phase at a temperature of at most 100° C., more preferably at most 120° C., further preferably at most 140° C.

Further, the above-mentioned glass transition temperature (Tg) may preferably be at least 60° C., further preferably at least 80° C.

The (solidified) polymeric compound of the present invention may be prepared by polymerizing a liquid crystal compound having a polymerizable functional group, thus obtaining a solidified polymer liquid crystal having a molecular structure comprising at least two recurring units of liquid crystal compound. More specifically, the resultant polymer liquid crystal may include a main chain-type polymer liquid crystal having a main chain component derived from a bar-shaped liquid crystal compound having a polymerizable functional group as a monomer and a side chain-type polymer liquid crystal having a side chain component derived from a bar-shaped liquid crystal compound having a polymerizable functional group.

The polymeric compound (polymeric liquid crystal) of the present invention has an average molecular weight (principally as a number-average molecular weight) of at least 5,000, as measured by GPC (gel permeation chromatography).

In the electronic device according to the present invention, the polymeric compound may preferably be used in such a state that a monodomain is formed in an alignment-treated condition or in a thin film state closer thereto. Specifically, such an alignment-treated polymeric compound may be formed by (1) disposing a polymeric compound on a substrate which has been subjected to alignment treatment or (2) promoting a polymerization reaction by light irradiation or heating after a liquid crystal compound having a polymerizable functional group is subjected to alignment treatment.

According to the production process of the polymeric compound (smectic polymer liquid crystal) of the present invention, the polymeric compound is produced through polymerization of a liquid crystal compound having a polymerizable functional group in a liquid crystal state providing the liquid crystal compound with a hexagonal system order. The liquid crystal compound refers to a low molecular weight liquid crystal compound having a molecular weight of about 500.

In a preferred embodiment, the liquid crystal compound having a polymerizable functional group is disposed on a substrate which has been subjected to alignment treatment to be aligned or oriented and then is subjected to, e.g., photopolymerization in a higher order liquid crystal phase state providing a hexagonal system order to readily prepare a (solidified) polymeric compound while retaining the liquid crystal state providing the hexagonal system order.

According to our experiment, a polymeric compound obtained through polymerization in a liquid crystal phase state exhibits a higher carrier mobility (electron/hole mobility) than that obtained through polymerization in an isotropic (or liquid) phase state by about one to three digits. This property is held even when the polymeric compound is placed in a glassy state.

The above difference in carrier mobility may be attributable to a difference in molecular alignment state (of the liquid crystal compound used) at the time of polymerization. This shows that, in the production process of the present invention, the (higher) alignment order of liquid crystal is retained even after the polymerization.

The polymerizable liquid crystal compound (i.e., the liquid crystal compound having a polymerizable functional group) used in the present invention may include, e.g., a smectic liquid crystal having an acrylic group or a methacrylic group at a terminal portion or an intermediate portion. The resultant polymeric compound of the present invention may partially contain a low molecular weight liquid crystal component in order to control some properties such as transition temperatures (glass transition temperature, phase transition temperature, etc.) of the polymeric compound.

FIG. 1 shows a schematic sectional view of an embodiment of the electronic device using the polymeric compound according to the present invention.

Referring to FIG. 1, the electronic device includes substrates 11 and 12, electrodes 13 and 14, optional alignment films (alignment control layers) 15 and 16, and a layer 17 of a solidified smectic polymer liquid crystal (polymeric compound). At least one of the substrates 11 and 12 may comprise a transparent substrate of glass, etc. Further, at least one of the electrodes 13 and 14 formed on the transparent substrate(s) may be formed of a transparent conductive material such as ITO (indium tin oxide).

The electronic device as shown in FIG. 1 may be prepared in the following manner.

After the electrodes 13 and 14 are formed on the substrates 11 and 12, respectively, the alignment films 15 and 16 for aligning the polymeric compound of the present invention are formed, as desired.

The thus-treated substrates 11 and 12 are disposed opposite to each other with a prescribed spacing determined by, e.g., spacer beads (not shown) so that the electrodes 13 and 14 (or the optional alignment films 15 and 16) have opposing surfaces, followed by sealing with a sealing agent (not shown) to leave an opening (injection port for liquid crystal), thus preparing a blank cell. A polymerizable liquid crystal compound is injected to align the polymerizable liquid crystal compound in the cell, followed by, e.g., UV (ultraviolet) light irradiation from the transparent substrate side in such a state the polymerizable liquid crystal compound has a hexagonal system order (in a higher order smectic phase) to effect polymerization of the liquid crystal compound, thus obtaining a layer 17 of a polymeric compound having a hexagonal system order.

The resultant polymeric compound layer 17 can include an unpolymerized or insufficiently polymerized liquid crystal compound component but such a component can contribute to improvement in characteristics, such as carrier transport performance while being resistant to the lamination process similar to the polymerized component.

The polymeric compound has an (number-) average molecular weight of 5,000 as measured by using GPC as described above.

When the polymeric compound is prepared, a polymerization degree is not readily increased in some cases due to a molecular structure of a starting liquid crystal material (polymerizable liquid crystal compound). On the other hand, when the polymerization degree is excessively increased to provide a larger molecular weight, the resultant polymer film (layer) is liable to crack, thus resulting in poor film properties and lowering practical performance. Accordingly, in the present invention, the polymeric compound may preferably have an (number-) average molecular weight of 10,000–500,000. In this molecular weight range, the polymeric compound is resistant to the lamination process and provides excellent device characteristics while keeping a high carrier transport performance in the higher order smectic (liquid crystal) phase.

Figure 2:
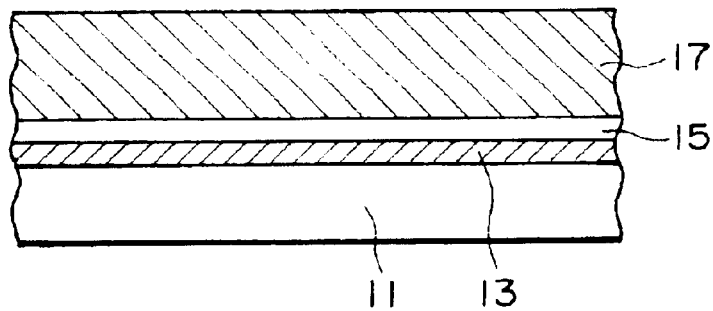
FIG. 2 is a view explaining the process for producing an electronic device according to the present invention.

FIG. 2 shows a schematic sectional view illustrating an embodiment of the process for producing the polymeric compound of the present invention.

Referring to FIG. 2, on a substrate 11 coated with an electrode 13 and an optional alignment film 15, a polymerizable liquid crystal compound is disposed by e.g., coating or dipping and is aligned by, e.g., annealing, followed by UV-light irradiation in a liquid crystal phase state providing a hexagonal system order similar to the above-described manner to polymerize the polymerizable liquid crystal compound, thus obtaining a solidified polymeric compound layer 17 while retaining the hexagonal system order.

When the alignment film is used for constituting the electronic device of the present invention, the alignment film may preferably be one used for aligning the conventional smectic liquid crystal materials, such as a polyimide film subjected to rubbing treatment.

The layer structures of the electronic device of the present invention shown in FIGS. 1 and 2 may appropriately be modified in view of desired performances of the electronic device (liquid crystal device) when used for functional devices described hereinafter.

More specifically, at least one necessary functional layer may appropriately be formed before the formation of the solidified smectic polymer liquid crystal (polymeric compound) layer 17 in the case of the device shown in FIG. 1 or before and/or after the formation of the polymeric compound layer 17 in the case of the device shown in FIG. 2. When the polymeric compound of the present invention is produced, it is possible to appropriately add additives, such as a (photo-)polymerization initiator and a polymerization stabilizer, to the polymerizable (bar-shaped) liquid crystal compound.

The above-prepared electronic device of the present invention may basically have a cell structure including the polymeric compound layer 17 disposed between a pair of oppositely disposed electrodes 13 and 14. The electronic device may optionally include the pair of substrates 11 and 12 sandwiching the pair of electrodes 13 and 14, as desired, as shown in FIG. 1. Further, the electronic device may include at least one functional layer for constituting an objective functional device.

By using the electronic device of the present invention, it is possible to constitute various functional devices, preferably those using the polymeric compound of the present invention in a carrier injection/transport layer. More specifically, the polymeric compound is used in an electron or hole transport layer in the case of a photoconductive member used in an electrophotographic process, an organic EL device, an LED, etc. Further, in the case where the electronic device is used in a primary or secondary battery, the layer of polymeric compound is used as an ion transport layer.

When the electronic device of the present invention is used in the electrophotographic process, a carrier generation layer for generating a carrier by light irradiation may preferably be formed in addition to the polymeric compound (carrier transport) layer. These carrier generation and transport layers arc formed by lamination in many cases.

In the case of constituting the organic EL device or the LED, it is possible to form an electron or hole transport layer of the polymeric compound of the present invention. In this case, the polymeric compound layer may further contain a luminescent material, thus constituting a luminescence layer. Further, a carrier (electron/hole) transport layer may preferably be formed on or under the polymeric compound layer, as desired, to prepare a desired organic EL device or LED.

As described above, the electronic device of the present invention may be constituted by forming the luminescence layer and another carrier transport layer by lamination on the polymeric compound layer, as desired. In this case, the polymeric compound of the present invention is a firm solid, thus being more stable against a stress exerted on films formed during the lamination compared with the case of using a flexible liquid crystal compound layer as in conventional liquid crystal devices. As a result, it becomes possible to prepare a highly reliable electronic device.

Further, conventional electronic devices using a higher order smectic liquid crystal are problematic in that the smectic liquid crystal inevitably causes a phase transition into a crystal phase. On the other hand, the electronic device of the present invention is constituted using the (solidified) polymeric compound, so that the polymeric compound is stable against phase change even at low temperature and sufficiently retains its liquid crystal phase even at high temperature or at temperatures of 60–80° C., thus exhibiting a stable state over a broader temperature range. The polymeric compound of the present invention is characterized by a higher order liquid crystal alignment structure having a hexagonal system order and a solid form in combination, thus allowing realization of an electronic device excellent in performance and reliability.

Figure 3:
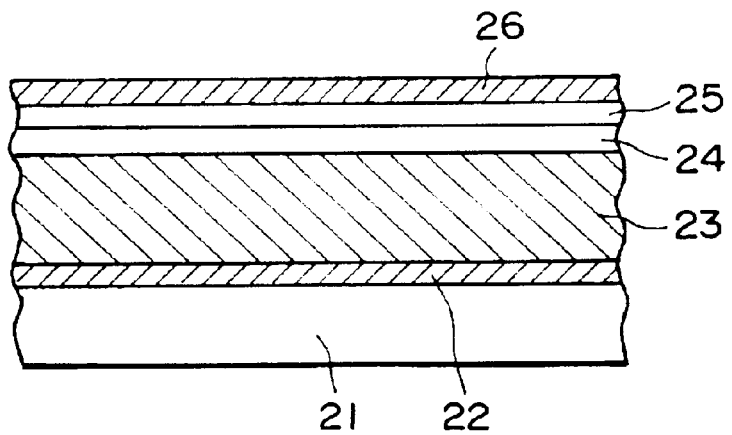
FIG. 3 is a schematic sectional view of a luminescent device used in Example 5 appearing hereinafter.

FIG. 3 shows a schematic sectional view of an embodiment of the electronic device of the present invention constituted as an organic EL device.

Referring to FIG. 3, the EL device includes substrate 21 of, e.g., glass, an electrode 22 of, e.g., ITO disposed on the substrate, a layer 23 of the polymeric compound of the present invention disposed on the electrode 22, a hole transport layer 24 of, e.g., α-NPD (bis[N-1-(naphthyl)-N-phenyl]benzidine) disposed on the polymeric compound layer 23, a luminescence layer 25 of, e.g., Alq3 (tris(8-quinolinolato)aluminum) disposed on the hole transport layer 24, and an electrode 26 of, e.g., aluminum disposed on the luminescence layer 25.

When using the electronic device of the present invention as a luminescence device, such as the organic EL device or the LED, the resultant luminescent device may be driven in a simple matrix driving manner or an active matrix driving manner.

More specifically, for example, the electronic device may be constituted as an organic EL device by providing a plurality of active elements, such as TFTs (thin film transistor) to a matrix of pixels, thus allowing an active matrix drive of the EL device pixel by pixel with higher definition and performance.

In such an active matrix-type organic EL device, on a substrate, a plurality of organic compound layers including the above-mentioned polymeric compound layer, hole transport layer, luminescence layer, and other necessary layers (e.g., electron transport layer etc.) are formed as shown in FIG. 3.

Figure 4:
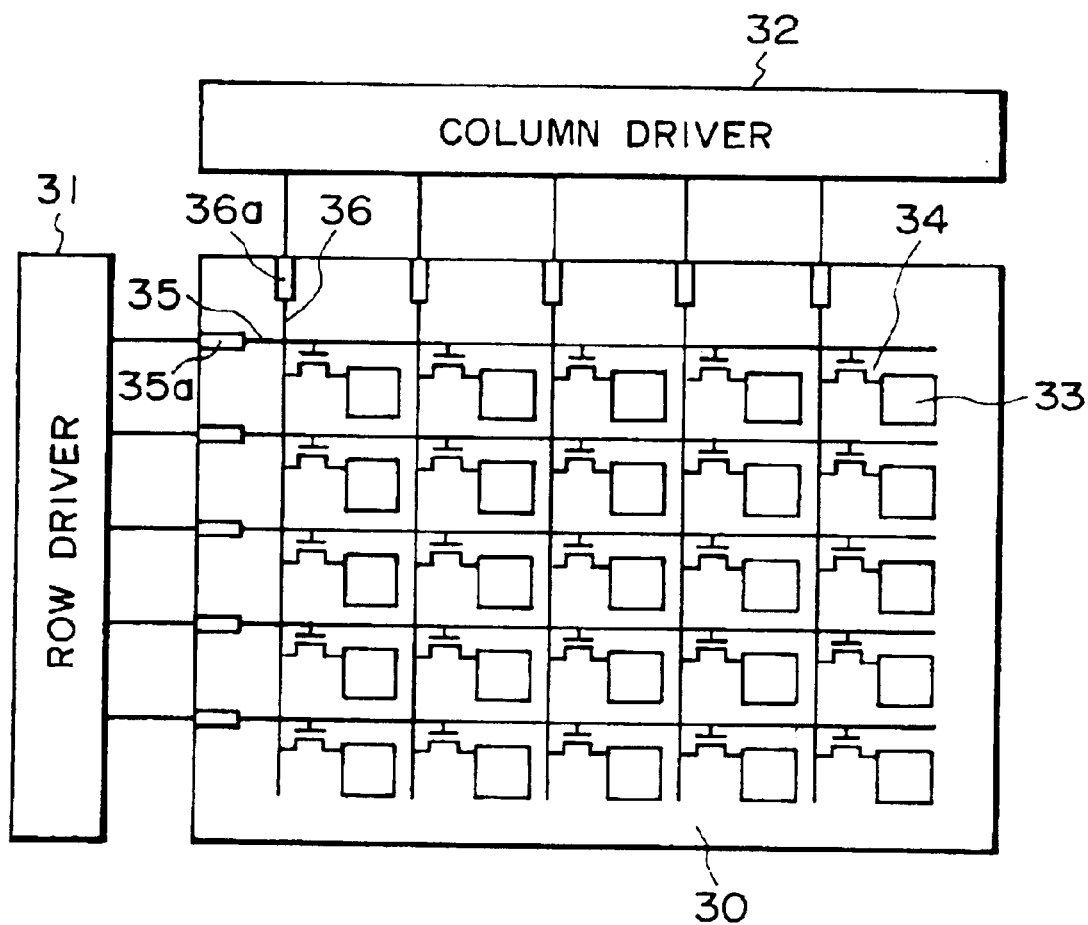
FIG. 4 is a schematic plan view of an embodiment of a luminescent device (EL device) as an electronic device of the present invention connected with an external drive circuit for driving the luminescence device in an active matrix driving manner.

FIG. 4 shows a schematic plan view of an embodiment of the electronic device of the present invention as the organic EL device and a voltage application circuit connected thereto for applying a voltage to the electronic device.

The electronic device used in this case may basically include a substrate provided with an active matrix circuit and an opposite substrate provided with a common electrode.

Referring to FIG. 4, on a substrate 30, an active matrix circuit comprising a plurality of pixel electrodes 33, each connected with a TFT 34, a plurality of gate lines (scanning lines) 35 and a plurality of source lines (data signal lines) 36 intersecting the gate lines 35 to define a matrix of pixels is formed.

The active matrix-type organic EL device is electrically connected with a row (scanning line) driver (voltage application circuit) 31 and a column (data signal line) driver (voltage application circuit) 32.

As shown in FIG. 4, on the substrate 30, the plurality of pixel electrodes 33 and TFTs 34 connected therewith are arranged in a matrix of rows and columns. Each of the TFTs 34 may be formed of, e.g., an amorphous silicon-based semiconductor, a polycrystalline polysilicon-based semiconductor, a microcrystalline-based semiconductor or a single crystalline-based semiconductor. The TFT 34 may, e.g., comprise a gate electrode formed on the substrate 30, a gate insulating film covering the gate electrodes, a semiconductor layer formed on the gate insulating film, and a source electrode and a drain electrode formed on the semiconductor layer. The rows of pixel electrodes 33 are defined by the gate lines 35, respectively, and the columns of pixel electrodes 33 are defined by the source lines 36, respectively.

For each TFT 34, the gate electrode is connected with a corresponding gate line 35, and the source electrode is connected with a corresponding source line 36. The gate line 35 is connected with the row driver 31 via a corresponding terminal 35a, and the source line 36 is connected with the column driver 32 via a corresponding terminal 36a. The row driver 31 supplies a gate signal to the respective gate lines 35, thus effecting scanning of the gate lines 35. The column driver 32 supplies a signal corresponding to display data to the respective source lines 36.

Each of the gate lines 35 is converted with the gate insulating film of an associated TFT 34 except for its terminal 35a, and each of the source lines 36 is formed on the gate insulation film. Each of the pixel electrodes 33 is also formed on the gate insulating film and is connected with an associated drain electrode of TFT 34 at one terminal thereof.

On the opposite substrate (not shown) disposed opposite to the substrate 30 (provided with the active matrix circuit), a common electrode (not shown) is formed so as to be opposite to the pixel electrodes 33. The common electrode comprises a single electrode having an area covering the entire display region and is supplied with a reference voltage.

In each pixel, an emitted light luminance can be changed depending on a magnitude of data signal voltage applied to a corresponding pixel electrode 33, thus effecting a gradational display. In some cases, each pixel may be provided with a capacitor providing an auxiliary capacitance.

Hereinbelow, the present invention will be described more specifically based on examples.

EXAMPLE 1

In this embodiment, a smectic liquid crystal A having a polymerizable functional group shown below was used for producing a polymeric compound according to the present invention.

Smectic Liquid Crystal A

Ph: 1,4-phenylene group
Phase transition temperature (° C.)

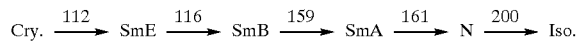

Cry.: crystal phase
SmE: smectic E phase
SmB: smectic B phase
SMA: smectic A phase
N: entire phase
ISO.: isotropic phase An electronic (liquid crystal) device was prepared in the following manner.

Two 1.1 mm-thick glass substrates, each provided with a 70 nm-thick film of ITO (indium tin oxide), were prepared.

Onto each of the glass substrates, a 2.1 wt. % solution of a polyamic acid (polyimide precursor) represented by a formula shown below was applied by spin coating (first coating for 5 seconds at 500 rpm and second coating for 30 seconds at 1500 rpm).

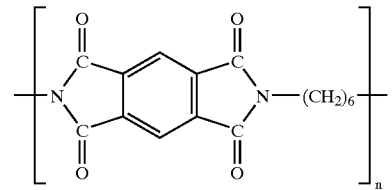

Thereafter, the substrate provided with the polyimide precursor was pre-dried at 80° C. for 5 minutes, followed by hot-baking at 220° C. for 1 hour to obtain an approximately 10 nm-thick polyimide film.

The polyimide film was subjected to rubbing treatment (uniaxial alignment treatment) with a nylon cloth.

On one of the thus-treated glass substrates, a 0.01 wt. % solution of resinous (spacer) beads (average diameter: 6 μm) in IPA (isopropyl alcohol) was applied by spin coating at 1500 rpm for 10 seconds at a dispersion density of 100 particles/mm², and a thermosetting liquid resin was coated by a printing process.

The thus-treated glass substrates were applied to each other so that their rubbing axes were in parallel with each other, followed by hot-baking in an oven at 150° C. for 90 minutes to obtain a blank cell having an electrode area (planar area) of 0.9 cm².

Into the blank cell, a mixture B prepared by mixing the above-mentioned smectic liquid crystal A with 2 wt. % of a photopolymerization initiator (Irgacure 184, mfd. by Ciba-Geigy Corp.) was injected at a nematic phase temperature to prepare cell 1, followed by observation through a polarizing microscope with a hot stage (available from Mettler Co.).

As a result, a good uniaxial alignment state was observed in any liquid crystal phase including liquid crystal phases of N, SmA, SmB and SmE.

Separately, the mixture B was sandwiched between a pair of glass sheets for microscopic observation to prepare cell 2, wherein liquid crystal molecules of the smectic liquid crystal A were not aligned.

The thus-prepared two cells (cells 1 and 2) were subjected to exposure to UV (ultraviolet) light at 130° C. (SmB phase temperature) for 10 minutes, by using a high pressure mercury lamp (output: 12 mW/cm²), thus effecting polymerization of the smectic liquid crystal A.

When the above-prepaed cell 1 was set in a hot stage (available from Mettler Co.) and subjected to observation through a polarizing microscope, a good uniaxial alignment state substantially identical to that observed in SmB before the polymerization was confirmed in a temperature range from room temperature (20–25° C.) to 160° C. Similarly, also in the cell 2 (using no alignment film), a good uniaxial alignment state was observed in the temperature range.

Further, when the smectic liquid crystal A was polymerized in a bulk state, the resultant polymeric compound had a number-average molecular weight of 130,000. When the polymeric compound was subjected to DSC measurement, a large phase transition peak was confirmed at 167° C., and a glass transition temperature was 105° C.

Further, when the polymeric compound obtained through the bulk state polymerization was subjected to x-ray diffraction analysis at 100° C. and 30° C., identical diffraction peaks were obtained at 100° C. and 30° C. From the thus-measured diffraction peaks, lattice spacings of 29.4 Å, 15.5 Å, 10.4 Å, 7.8 Å, 5.2 Å, 4.5 Å and 3.5 Å were obtained. Of these lattice spacings, those of 4.5 Å and 3.5 Å were derived from diffraction peaks attributable to hexagonal system order.

Accordingly, in this example, it was confirmed that the higher order smectic phase (SmB phase) providing hexagonal system order was held in the resultant polymeric compound.

The above-mentioned x-ray diffraction analysis was performed in a relatively larger region (having a planar area of 1 cm²). As a result, it was confirmed that hexagonal system order was stably formed in the region.

EXAMPLE 2

A mixture C was prepared by mixing the mixture B prepared in Example 1 with 0.5 wt. % of quinacridone.

An electronic device was prepared in the same manner as in Example 1 except that the mixture C was used in place of the mixture B, the polyimide (alignment) film was not used, and the spacer beads (average particle size: 6 μm) were changed to those having an average particle size of 1 μm.

When the thus-prepared electronic device (after polymerization) was set in a hot stage and subjected to observation through a polarizing microscope in the same manner as in Example 1, a good uniaxial alignment state was observed in a temperature range from room temperature to 160° C., thus confirming that the resultant polymeric compound had hexagonal system order in the higher order smectic phase (SmB phase).

Further, when a DC voltage of 50 volts was applied between the pair of electrodes (ITO film) of the electronic device, it was confirmed that luminescence occurred from the polymeric compound layer.

Comparative Example 1

An electronic device was prepared and evaluated in the same manner as in Example 2 except that the polymerization was performed at 210° C. (isotropic phase temperature).

As a result of observation through a polarizing microscope, a uniform alignment state was not confirmed at all, and the resultant polymeric compound was found to be solidified in an isotropic state.

Further, although a DC voltage was applied between the pair of electrodes of the electronic device while increasing the voltage value up to 100 volts, no luminescence was confirmed from the polymeric compound layer.

EXAMPLE 3

An electronic device was prepared and evaluated in the same manner as in Example 1 except that the polymerization was performed at 114° C. (SmE phase temperature).

Similar results as in Example 1 were also attained in this example, thus confirming that the resultant polymeric compound had hexagonal system order in the higher order smectic phase (SmE phase).

EXAMPLE 4

An electronic device was prepared and evaluated in the same manner as in Example 2 except that one of the ITO films (transparent electrodes) was changed to one provided with a dot matrix pattern (comprising a matrix of a plurality of dots (pixels)) (each dot size: 100 μm×100 μm).

As a result, it was confirmed that the resultant polymeric compound had hexagonal system order in the higher order smectic phase (SmB phase). Further, when the respective dots of the ITO electrode were supplied with a driving signal voltage (DC=60 volts), a dot(-based) luminescence was confirmed at a dot supplied with the driving signal voltage, thus allowing a dot(-based) pattern display.

EXAMPLE 5

An organic EL device as shown in FIG. 3 was prepared in the following manner.

A solution in chloroform of 1 wt % of the smectic liquid crystal A used in Example 1 and 0.02 wt. % of a photopolymerization initiator (Irgacure 184) was prepared and applied onto a 1.1 mm-thick glass substrate provided with a 70 nm-thick ITO film (transparent electrode as cathode) by spin coating at 1000 rpm for 20 seconds to form a 45 nm-thick liquid crystal layer.

Thereafter, the liquid crystal layer was subjected to exposure to UV light in the same manner as in Example 1 to effect polymerization of the smectic liquid crystal A.

On the liquid crystal layer, a 5 nm-thick hole transport layer of α-NPD (shown below (hole transport material) and a 5 nm-thick luminescence layer of Alq3 (shown below) (luminescent material) were successively formed by vacuum deposition (10⁻⁴ Pa).

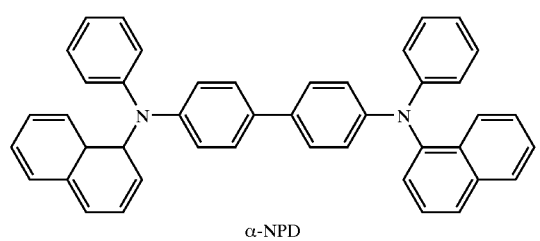

α-NPD

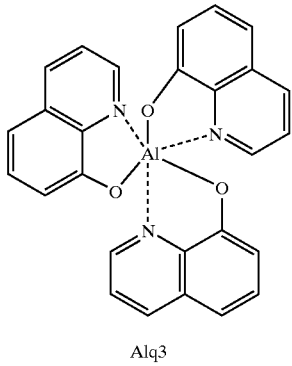

Alq3

On the luminescence layer, a 100 nm-thick aluminum layer (metal electrode as anode) was formed by vacuum deposition, thus preparing an organic EL device.

When a voltage of 20 volts was applied between the ITO electrode (cathode) and the aluminum electrode (anode), a green luminescence (attributable to Alq3) was confirmed. Accordingly, the polymeric compound of the present invention was found to exhibit an excellent performance as a hole injection and/or transfer layer. Further, the green luminescence state was stably retained even when the EL device was energized for a long period of time.

As described hereinabove, according to the present invention, it is possible to readily provide a stable higher order liquid crystal phase in an operational temperature range. Further, the polymeric compound of the present invention is provided in a solidified polymer liquid crystal state, thus being resistant to the lamination process. In addition, the higher order liquid crystal phase given by the polymeric compound of the present invention allows a high carrier transport performance. As a result, a functional device (electronic device) using the polymeric compound, such as a luminescent device or a semiconductor device, is improved in device characteristics and reliability.

What is claimed is:

1. A polymeric compound having a smectic phase and a hexagonal system order in the smectic phase, wherein said polymeric compound is a product of the polymerization of $CH_2=C(CH_3)COO(CH_2)_5PhCOOPhPhCF_3$ and wherein Ph is a 1,4-phenylene group.

2. The compound according to claim 1, which has an average molecular weight of 10,000–500,000.

3. The compound according to claim 1, wherein the smectic phase is a liquid crystal phase selected from the group consisting of smectic B phase, smectic L phase, smectic E phase, smectic I phase, smectic F phase, smectic J phase, smectic G phase, smectic K phase, and smectic H phase.

4. The compound according to claim 1, which is placed in a glassy liquid crystal state in the smectic phase.

5. An electronic device comprising:

at least one substrate, two electrodes disposed on said at least one substrate, and a polymer layer of at least one species of polymeric compound disposed between the two electrodes, wherein said at least one species of polymeric compound has a smectic phase and a hexagonal system order in the smectic phase, wherein said polymeric compound is a product of the polymerization of $CH_2=C(CH_3)COO(CH_2)_5PhCOOPhPhCF_3$ and wherein Ph is a 1,4-phenylene group.

6. The device according to claim 5, wherein the polymer layer disposed between the two electrodes is supplied with a voltage via the two electrodes to cause luminescence from the polymer layer.

7. The device according to claim 5, further comprising a luminescence layer of a luminescent material disposed together with the polymer layer between the two electrodes.

8. A process for producing an electronic device of the type wherein a polymer layer of at least one species of polymeric compound is disposed between a pair of electrodes on a substrate, said process comprising a step of:

forming a polymer layer of at least one species of polymeric compound by polymerizing $CH_2=C(CH_3)COO(CH_2)_5PhCOOPhPhCF_3$, wherein Ph is a 1,4-phenylene group and wherein said at least one species of polymeric compound has a smectic phase and a hexagonal system order in the smectic phase.

* * * * *